(12) United States Patent
Greco et al.

(10) Patent No.: US 10,211,324 B2
(45) Date of Patent: Feb. 19, 2019

(54) VERTICAL P-TYPE, N-TYPE, P-TYPE (PNP) JUNCTION INTEGRATED CIRCUIT (IC) STRUCTURE

(71) Applicant: International Business Machines Corporation, Armonk, NY (US)

(72) Inventors: Joseph R. Greco, South Burlington, VT (US); Qizhi Liu, Lexington, MA (US); Aaron L. Vallett, Jericho, VT (US); Robert F. Vatter, St. Albans, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/795,884

(22) Filed: Oct. 27, 2017

(65) Prior Publication Data

US 2018/0069105 A1  Mar. 8, 2018

Related U.S. Application Data

(60) Continuation of application No. 15/073,763, filed on Mar. 18, 2016, now Pat. No. 9,837,514, which is a
(Continued)

(51) Int. Cl.
*H01L 29/732* (2006.01)
*H01L 29/66* (2006.01)
(Continued)

(52) U.S. Cl.
CPC ...... *H01L 29/732* (2013.01); *H01L 21/76232* (2013.01); *H01L 21/76879* (2013.01);
(Continued)

(58) Field of Classification Search
None
See application file for complete search history.

(56) References Cited

U.S. PATENT DOCUMENTS 4,717,677 A   1/1988   McLaughlin et al.
6,249,031 B1  6/2001   Verma et al.
(Continued)

OTHER PUBLICATIONS

Restriction Requirement for U.S. Appl. No. 14/457,524, dated Jun. 23, 2015, (IBMB-0435), 5 Pages.
(Continued)

*Primary Examiner* — Andres Munoz
(74) *Attorney, Agent, or Firm* — Steven J. Meyers; Hoffman Warnick LLC

(57) ABSTRACT

Various particular embodiments include an integrated circuit (IC) structure having: a stack region; and a silicon substrate underlying and contacting the stack region, the silicon substrate including: a silicon region including a doped subcollector region; a set of isolation regions overlying the silicon region; a base region between the set of isolation regions and below the stack region, the base region including an intrinsic base contacting the stack region, an extrinsic base contacting the intrinsic base and the stack region, and an amorphized extrinsic base contact region contacting the extrinsic base; a collector region between the set of isolation regions; an undercut collector-base region between the set of isolation regions and below the base region; and a collector contact region contacting the collector region under the intrinsic base and the collector-base region via the doped subcollector region.

2 Claims, 5 Drawing Sheets

Related U.S. Application Data division of application No. 14/834,699, filed on Aug. 25, 2015, now Pat. No. 9,735,259, which is a division of application No. 14/457,524, filed on Aug. 12, 2014, now Pat. No. 9,324,828.

(51) Int. Cl.

| | | |
|---|---|---|
| *H01L 29/10* | (2006.01) | |
| *H01L 21/768* | (2006.01) | |
| *H01L 29/06* | (2006.01) | |
| *H01L 29/08* | (2006.01) | |
| *H01L 29/16* | (2006.01) | |
| *H01L 29/423* | (2006.01) | |
| *H01L 29/45* | (2006.01) | |
| *H01L 27/082* | (2006.01) | |
| *H01L 21/762* | (2006.01) | |
| *H01L 27/06* | (2006.01) | |
| *H01L 29/417* | (2006.01) | |
| *H01L 21/8249* | (2006.01) | |

(52) U.S. Cl.
CPC ...... *H01L 27/0826* (2013.01); *H01L 29/0649* (2013.01); *H01L 29/0653* (2013.01); *H01L 29/0804* (2013.01); *H01L 29/0821* (2013.01); *H01L 29/1004* (2013.01); *H01L 29/16* (2013.01); *H01L 29/42304* (2013.01); *H01L 29/456* (2013.01); *H01L 29/66272* (2013.01); *H01L 29/66287* (2013.01); *H01L 21/8249* (2013.01); *H01L 27/0623* (2013.01); *H01L 29/41708* (2013.01); *H01L 29/66234* (2013.01)

(56) References Cited

U.S. PATENT DOCUMENTS

| | | |
|---|---|---|
| 6,501,152 B1 | 12/2002 | Johnson |
| 7,217,609 B2 | 5/2007 | Norstrom et al. |
| 9,735,259 B2 * | 8/2017 | Greco .................. H01L 29/732 |
| 9,837,514 B2 * | 12/2017 | Greco ................ H01L 29/0649 |
| 2005/0212087 A1 | 9/2005 | Akatsu et al. |
| 2012/0098039 A1 | 4/2012 | Miu et al. |
| 2014/0353725 A1 | 12/2014 | Adkisson et al. |

OTHER PUBLICATIONS

Notice of Allowance and Fee(s) Due U.S. Appl. No. 14/457,524, dated Jan. 29, 2016, (IBMB-0435), 11 Pages.
Office Action for U.S. Appl. No. 14/834,699, dated Dec. 30, 2016.
Notice of Allowance for U.S. Appl. No. 14/834,699, dated Apr. 11, 2017. 16 pages.
Notice of Allowance for U.S. Appl. No. 15/073,763, dated Jul. 27, 2017. 16 pages.
Office Action for U.S. Appl. No. 15/073,763, dated Dec. 29, 2016. 18 pages.

* cited by examiner

VERTICAL P-TYPE, N-TYPE, P-TYPE (PNP) JUNCTION INTEGRATED CIRCUIT (IC) STRUCTURE

BACKGROUND

The subject matter disclosed herein relates to integrated circuits. More particularly, the subject matter relates to integrated circuit structures, e.g., bi-polar junction complimentary metal-on-oxide semiconductor (BiCMOS) structures.

As devices relying upon integrated circuits (ICs) have increased in complexity and functionality, those devices have required ever more dynamic ICs to meet the demands of those device users. For example, in BiCMOS IC structures, p-type; n-type; p-type (PNP) transistor regions are generally slower (for switching) than NPN transistor regions. However, a vertical PNP transistor region can exhibit relatively high switching speeds when the n-type region is thinned, allowing for faster transmission between p-type regions. The vertical PNP transistor built according to conventional approaches, however, requires several different mask steps (and distinct masks) in order to form, and can result in a large collector-base (CB) junction, which contributes to parasitic losses. These parasitic loses can negatively effect the performance of the BiCMOS having the PNP transistor region.

BRIEF DESCRIPTION

Various embodiments include a method including: forming a mask over a precursor structure, the precursor structure having: a stack region; and a silicon substrate underlying and contacting the stack region, the silicon substrate including: a silicon region including a doped subcollector region; a set of isolation regions overlying the silicon region; a base region between the set of isolation regions and below the stack region, the base region including an intrinsic base contacting the stack region, an extrinsic base contacting the intrinsic base and the stack region, and an extrinsic base contact region contacting the extrinsic base; a collector region between the set of isolation regions; and a collector contact region contacting the collector region under the intrinsic base via the doped subcollector region; etching through each of the isolation regions into the silicon region using the mask to form a trench in each of the isolation regions; undercut etching the silicon region through the trench to form a cavity, wherein the silicon substrate etches at a rate greater than an etch rate of each of the isolation regions, the extrinsic base contact region, and the collector contact region; and sealing the cavity and the trench.

A first aspect includes a method including: forming a mask over a precursor structure, the precursor structure having: a stack region; and a silicon substrate underlying and contacting the stack region, the silicon substrate including: a silicon region including a doped subcollector region; a set of isolation regions overlying the silicon region; a base region between the set of isolation regions and below the stack region, the base region including an intrinsic base contacting the stack region, an extrinsic base contacting the intrinsic base and the stack region, and an extrinsic base contact region contacting the extrinsic base; a collector region between the set of isolation regions; and a collector contact region contacting the collector region under the intrinsic base via the doped subcollector region; etching through each of the isolation regions into the silicon region using the mask to form a trench in each of the isolation regions; undercut etching the silicon region through the trench to form a cavity, wherein the silicon substrate etches at a rate greater than an etch rate of each of the isolation regions, the extrinsic base contact region, and the collector contact region; and sealing the cavity and the trench.

A second aspect includes a method including: forming a mask over a precursor structure, the precursor structure having: a stack region including a portion of a vertical p-type, n-type, p-type transistor (PNP); and a silicon substrate underlying and contacting the stack region, the silicon substrate including: a silicon region including a doped subcollector region; a set of isolation regions including amorphized silicon overlying the silicon region; a base region between the set of isolation regions and below the stack region, the base region including an intrinsic base contacting the stack region, an extrinsic base contacting the intrinsic base and the stack region, and an extrinsic base contact region contacting the extrinsic base, wherein the extrinsic base contact region includes amorphized silicon; a collector region between the set of isolation regions; and a collector contact region contacting the collector region under the intrinsic base via the doped subcollector region; etching through each of the isolation regions into the silicon region using the mask to form a trench in each of the isolation regions; undercut etching the silicon region through the trench to form a cavity, wherein the silicon substrate etches at a rate greater than an etch rate of the amorphized silicon in each of the isolation regions and the amorphized silicon in the extrinsic base contact region; and sealing the cavity and the trench.

A third aspect includes an integrated circuit (IC) structure including: a stack region; and a silicon substrate underlying and contacting the stack region, the silicon substrate including: a silicon region including a doped subcollector region; a set of isolation regions overlying the silicon region; a base region between the set of isolation regions and below the stack region, the base region including an intrinsic base contacting the stack region, an extrinsic base contacting the intrinsic base and the stack region, and an amorphized extrinsic base contact region contacting the extrinsic base; a collector region between the set of isolation regions; an undercut collector-base region between the set of isolation regions and below the base region; and a collector contact region contacting the collector region under the intrinsic base and the collector-base region via the doped subcollector region.

A fourth aspect includes an integrated circuit (IC) structure having: a stack region; and a silicon substrate underlying and contacting the stack region, the silicon substrate including: a silicon region including a doped subcollector region; a set of isolation regions overlying the silicon region; a base region between the set of isolation regions and below the stack region, the base region including an intrinsic base contacting the stack region, an extrinsic base contacting the intrinsic base and the stack region, and an amorphized extrinsic base contact region contacting the extrinsic base; a collector region between the set of isolation regions; an undercut collector-base region between the set of isolation regions and below the base region, wherein the undercut collector-base region abuts the isolation region and the amorphized extrinsic base contact region; and a collector contact region contacting the collector region under the intrinsic base and the collector-base region via the doped subcollector region, wherein the IC structure forms a portion of a bi-polar complementary metal-on-oxide semiconductor (BiCMOS) structure.

A fifth aspect includes an integrated circuit (IC) structure including: a stack region; and a silicon substrate underlying and contacting the stack region, the silicon substrate including: a silicon region including a doped subcollector region; a set of isolation regions overlying the silicon region; a base region between the set of isolation regions and below the stack region, the base region including an intrinsic base contacting the stack region, an extrinsic base contacting the intrinsic base and the stack region, and an amorphized extrinsic base contact region contacting the extrinsic base, wherein the extrinsic base includes a silicide region; a contact contacting the silicide region in the extrinsic base; a collector region between the set of isolation regions; an undercut collector-base region between the set of isolation regions and below the base region; and a collector contact region contacting the collector region under the intrinsic base and the collector-base region via the doped subcollector region, wherein the IC structure forms a portion of a bi-polar complementary metal-on-oxide semiconductor (BiCMOS) structure.

A sixth aspect includes an integrated circuit (IC) structure having: a stack region; and a silicon substrate underlying and contacting the stack region, the silicon substrate including: a silicon region including a doped subcollector region; a set of isolation regions overlying the silicon region; a base region between the set of isolation regions and below the stack region, the base region including an intrinsic base contacting the stack region, an extrinsic base contacting the intrinsic base and the stack region, and an amorphized extrinsic base contact region contacting the extrinsic base; a collector region between the set of isolation regions; an undercut collector-base region between the set of isolation regions and below the base region, wherein the undercut collector-base region does not extend laterally beyond the set of isolation regions; and a collector contact region contacting the collector region under the intrinsic base and the collector-base region via the doped subcollector region.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
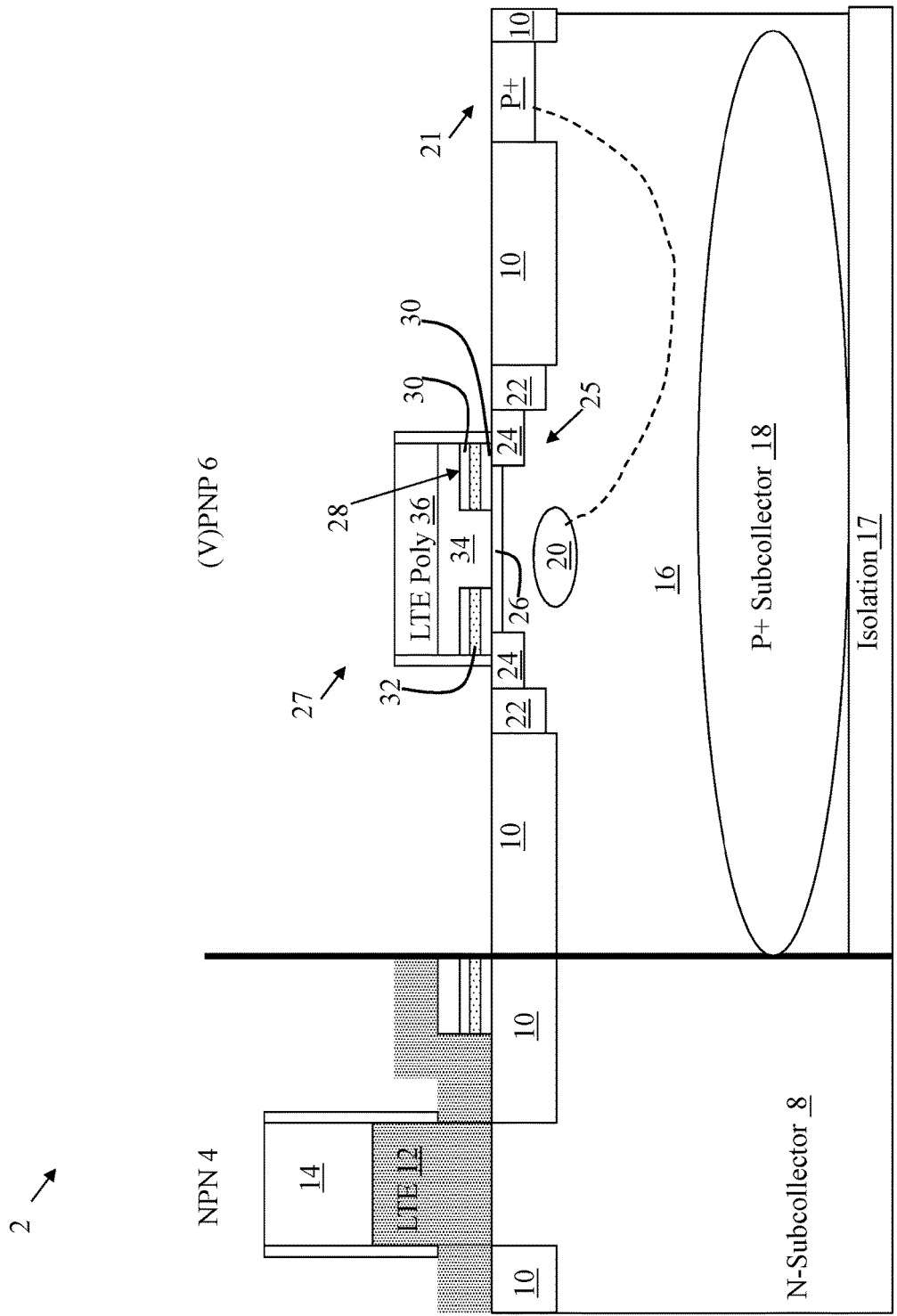
FIGS. 1-3 show cross-sectional views of a semiconductor structure undergoing processes according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuits (ICs). More particularly, in some cases, the subject matter relates to bi-polar junction complimentary metal-on-oxide semiconductor (BiCMOS) structures and methods of forming such structures.

As described herein, in BiCMOS IC structures, p-type; n-type; p-type (PNP) transistor regions are generally slower (for switching) than NPN transistor regions. However, a vertical PNP transistor region can exhibit relatively high switching speeds when the n-type region is thinned, allowing for faster transmission between p-type regions. The vertical PNP transistor built according to conventional approaches, however, requires several different mask steps (and distinct masks) in order to form, and can result in a large collector-base (CB) junction, which contributes to parasitic losses. These parasitic loses can negatively effect the performance of the BiCMOS having the PNP transistor region.

In contrast to conventional approaches, various embodiments include methods of forming an integrated circuit structure (e.g., a BiCMOS structure) having a vertical PNP transistor structure with a selectively sized (e.g., trimmed) collector-base (CB) junction. That is, the IC (e.g., BiCMOS) structures formed according to various embodiments reduce parasitic losses when compared to conventional IC structures having a vertical PNP transistor.

In particular embodiments, a method includes amorphizing (via implant) a portion of silicon underneath the N+ base section of a PNP transistor structure. After amorphizing, the process includes selectively etching that implant-amorphized silicon to trim the CB area (and consequently, the CB junction). The selective etching is possible because the unimplanted silicon region will etch at a distinct rate than the implant-amorphized silicon, allowing for control over the trimming of the CB junction.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

FIG. 1 shows a cross-sectional view of a precursor IC structure 2 (e.g., a precursor BiCMOS structure, or simply, "precursor structure") according to various embodiments. The precursor structure 2 includes a NPN section 4 and a PNP section 6, where the PNP section 6 is a vertical PNP transistor device. The NPN section 4 can include an N-type subcollector (NS) 8, which can include an n-doped substrate such as an n-doped silicon (Si) or silicon dioxide ($SiO_2$). Within the NS 8 are two isolation regions (e.g., shallow trench isolations (STIs) in some embodiments) 10, which can be formed according to any conventional approaches known in the art. That is, the isolation regions 10 can be formed by etching a shallow trench in the substrate 16 (e.g., silicon substrate), and filling that trench with silicon dioxide ($SiO_2$). According to various embodiments (where each isolation region 10 includes an STI), the isolation regions 10 include silicon dioxide. As described herein, various embodiments include approaches that etch through the isolation region(s) 10 and subsequently forming a trench below the isolation region(s) 10. Due to the properties of silicon dioxide, undercut etching below the isolation region(s) 10 will not etch the isolation region(s) 10. In alternative embodiments, the isolation region(s) 10 may be omitted (not formed), and the etching and trench formation can be performed directly in the silicon substrate 16. Overlying the isolation regions 10 and the NS 8 is a low-temperature epitaxy (LTE) layer 12. In various embodiments, the LTE layer 12 includes silicon, and is formed by low-temperature epitaxy over the underlying silicon in the NS 8 and the isolation regions 10. Over the silicon in the NS 8, the LTE layer 12 will grow as a single crystalline silicon, while over the isolation regions 10 or polysilicon regions, the LTE layer 12 will grow as a polysilicon layer. That is, the LTE layer 12 may have a different composition based upon the underlying layer where the epitaxial growth began. Overlying the LTE layer 12 is an emitter layer 14.

The vertical PNP section 6 can include a substrate 16 (having a doping), including an isolation region 17 (with opposite doping of the silicon substrate 16) and a P+ subcollector region 18. The substrate 16 can include silicon (Si), e.g., a bulk silicon. The P+ subcollector region 18 is a p-type doped region in the silicon substrate 16. A similar p-type doped region (e.g., pedestal), referred to as collector 20 is located above the P+ subcollector region 18 within the silicon substrate 18, and can be similarly doped as the P+ subcollector region. A collector contact region 21 can also be located within the silicon substrate 16, and can be p-type doped (e.g., including a P+ doped silicon). In various embodiments, the collector contact region 21 is located between isolation regions 10. As described herein, the collector contact region 21 can form an electrical connection with the collector 20, for example, through the substrate 16 (along path generally indicated by dashed line). As noted, the silicon substrate 16 includes at least one isolation region 10 (in some cases, STI) proximate the upper surface of the substrate 16. The precursor structure 2 also includes ion implant regions 22 (e.g., N+ ion implant regions in some embodiments) on the sides of an extrinsic base 24, which surround an intrinsic base region 26. The ion implant regions (base extension regions) 22 can include ion implants such as: argon (Ar) ions, neon (Ne) ions, silicon (Si) ions, indium (In) ions, oxygen (O) ions, germanium (Ge) ions, arsenic (As) ions, phosphorous (P) ions, or boron (B) ions. The ion implant regions can be formed using conventional masking and implanting approaches, for example, masking regions of the underlying silicon substrate 16 (excluding the to-be formed ion implant regions 22), and implanting the exposed region of the silicon substrate 16 with ions, resulting in amorphized silicon in the ion implant regions.

The ion implant regions 22 form extrinsic base contact regions, and lie between the extrinsic base 24 and adjacent STIs 10. Overlying the intrinsic base region 26 is a stack 27 including a portion of a vertical PNP transistor 28. The PNP transistor 28 includes p-type layers 30 with an intervening n-type layer 32. Between the PNP transistors 28 is an emitter region 34, and overlying the emitter region 34 is a polysilicon layer 36, all within the stack 27.

Figure 2:
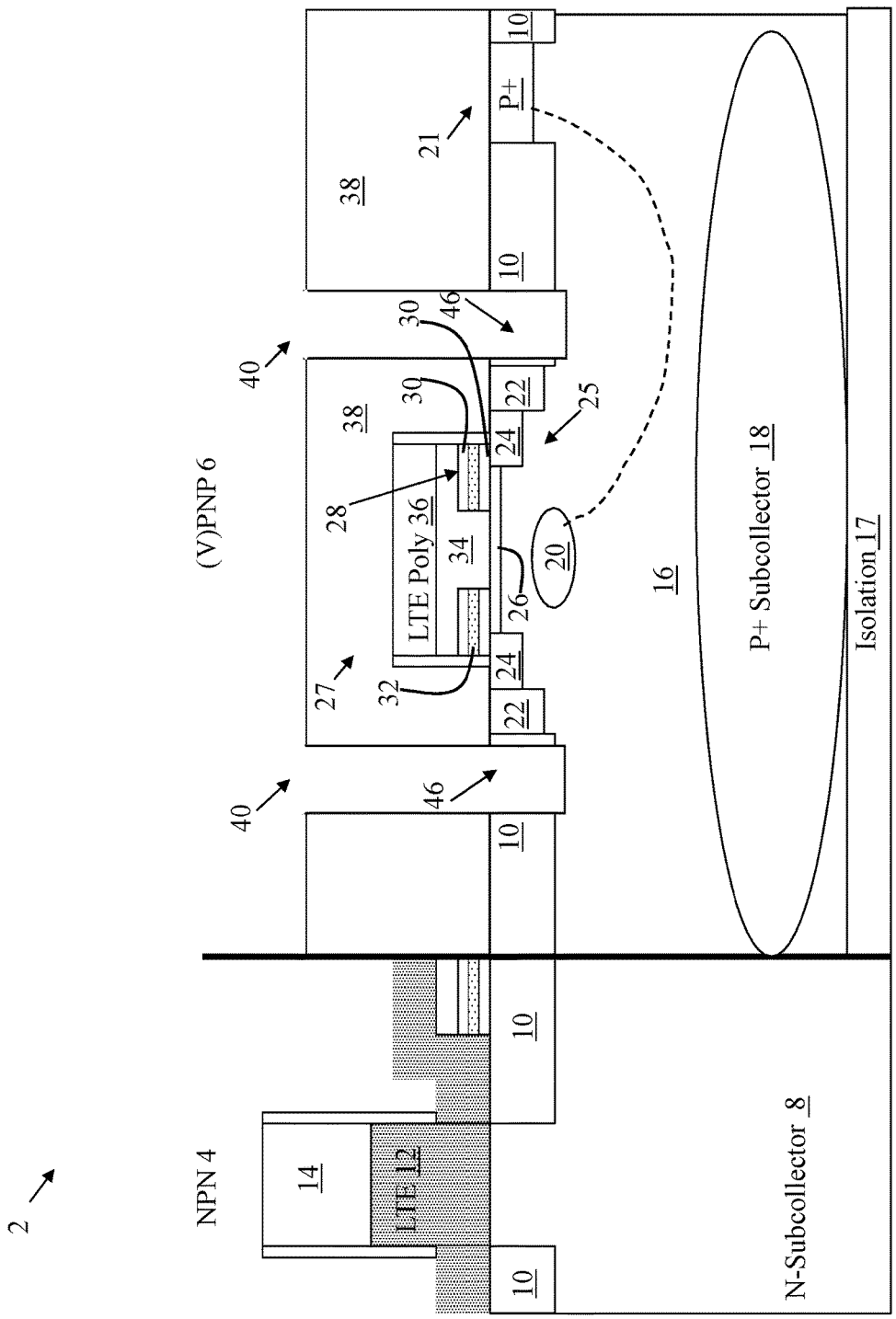

FIG. 2 illustrates a first process performed on the precursor structure 2 of FIG. 1 according to various embodiments. As shown, the process can include forming a mask 38 over the PNP section 6 of the precursor structure 2 (e.g., over the stack 27, extrinsic base 24, extrinsic base contacts 22 and isolation regions 10). The mask 38 can be any conventional mask used in photolithography to mask a portion of an underlying layer during a subsequent etching process. In various embodiments, the mask 38 can include a hard mask, and may be deposited, epitaxially grown, or otherwise formed over an upper surface of the PNP section 6 of the precursor structure 2, and exposed to form a pattern. The mask 38 can then be used, according to the pattern, to shield portions of the precursor structure 2 during a subsequent process. In this case, the mask 38 is formed to include openings 40 overlying the isolation regions 10 (adjacent the ion implant extrinsic base contacts 22), and according to various embodiments, a process can include etching through the isolation regions 10 using the mask 38 until reaching the underlying substrate 16.

Figure 3:
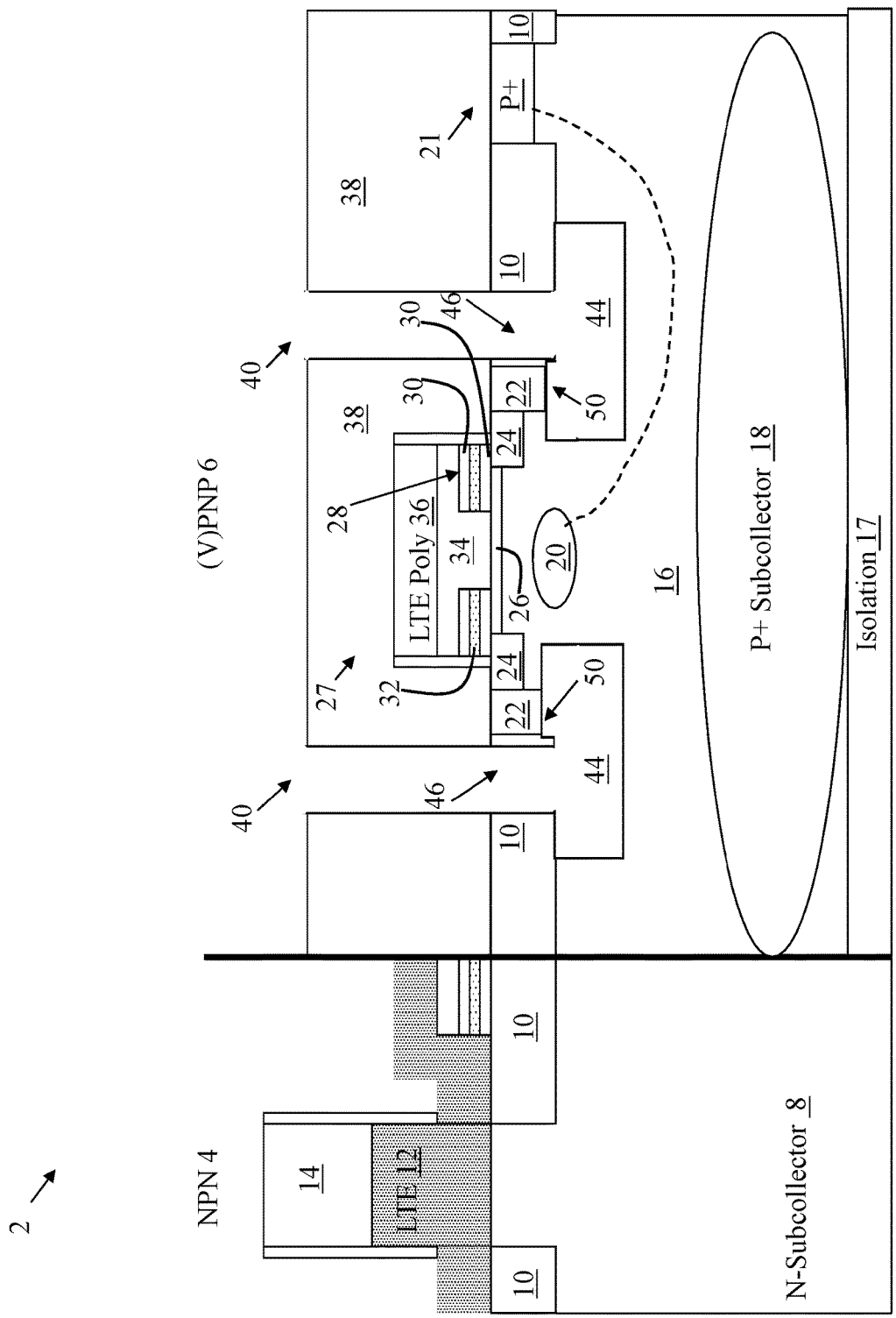

FIG. 3 shows a subsequent process including undercut etching the silicon substrate 16 underlying the isolation regions 10, the extrinsic base contacts 22 and the extrinsic base 24. The undercut etching is performed while the mask 38 remains in place over the precursor structure 2, and due to the ion implant of the extrinsic base contacts 22, these regions etch at a different rate than the silicon substrate 16. In various embodiments, the undercut etching is performed using a reactive ion etching (RIE) technique. Further, because the isolation region 10 includes $SiO_2$, the isolation region 10 etches at a different rate than the silicon substrate 16. That is, both the isolation region 10 and the extrinsic base contacts 22 etch at a slower rate (resist RIE etching) than the silicon substrate, causing the undercut etch to create a trench 44 underneath the isolation region 10 and the extrinsic base contact 22 without substantially modifying the aspect ratio of the opening 46 formed in the isolation region 10 during the initial etch (FIG. 2). That is, the aspect ratio (depth relative to width) of the opening 46 (cavity) in the isolation region 10 remains substantially unchanged during the undercut etching. The undercut etching may form trenches 44 that abut the lower surface 48 of the isolation region 10 and the lower surface 50 of the extrinsic base contact 22. The trenches may extend laterally from a region underlying the isolation region 10 to a region underlying the extrinsic base 24. In various embodiments, the undercut etching is performed using a wet chemical etch, e.g., ammonia hydroxide etching or potassium hydroxide etching. These wet chemical etches are crystalline-dependent, meaning that these etches have different speeds in different directions. In some embodiments, as shown in FIG. 3, an additional process can include removing the mask 38 after the undercut etching, e.g., by etching or using a conventional bath.

Figure 4:
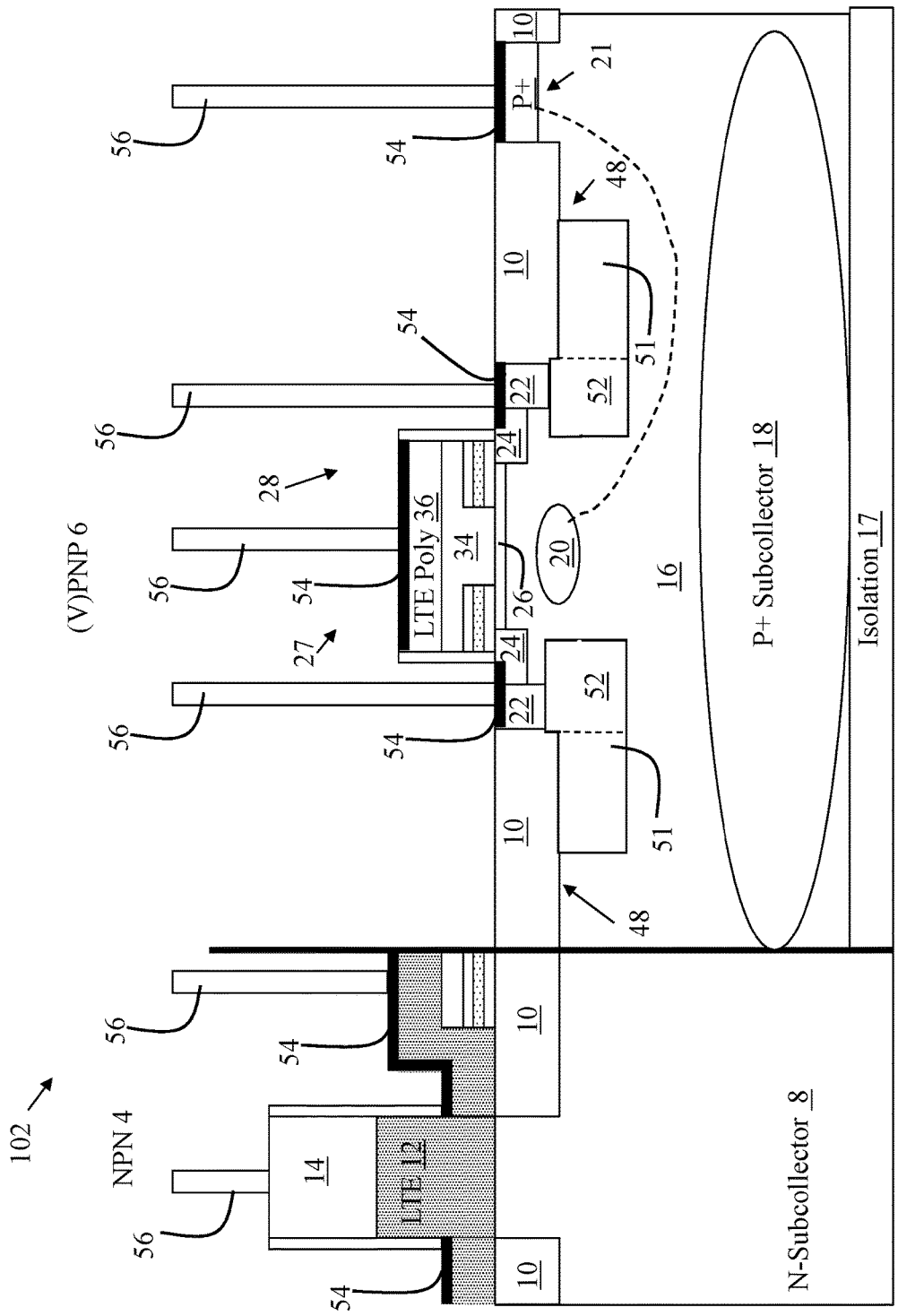
FIG. 4 shows a bi-polar complementary metal-on-oxide semiconductor (BiCMOS) structure according to various embodiments.

FIG. 4 shows subsequent processes according to various embodiments, forming an IC (e.g., BiCMOS) structure 102. As shown, the processes include forming an oxide 51 in the trenches 44, e.g., by depositing the oxide to fill each of the trenches 44. In various embodiments, the oxide 51 is deposited to completely fill the set of trenches 44. According to some embodiments, the oxide can include silicon dioxide ($SiO_2$).

In an alternative embodiment, the oxide 51 can be epitaxially grown within the trenches 44 to fill those trenches 44. In any case, the oxide 51 is formed to fill the trenches 44. Following filling the trenches 44 with oxide 51, various embodiments include re-filling the isolation regions 10 with $SiO_2$. The isolation regions 10 may then be planarized, e.g., using a reverse mask planarization process. Following planarizing of the isolation regions 10, a section of the extrinsic base contact 22 and the adjacent extrinsic base 24 may be converted to silicide 54 (by conventional processing), and contacts 56 can be formed to contact the silicide 54. The contacts 56 can include any conventional contact metal such as copper, aluminum, etc.

It is understood that prior to formation of the silicide 54 and contacts 56, the structure may be annealed, along with the isolation regions 10, after filling the isolation regions 10. In this embodiment, the extrinsic base contact 22 can be at least partially re-grown (healed) by the annealing to form the single crystalline Si region via solid phase regrowth. In various embodiments, an anneal is performed at approximately 400-800 degrees Celsius (in particular cases, around 500 degrees C.), for approximately 30 minutes to several hours.

As shown, a portion of the oxide 51 acts as a collector-base (CB) region 52, where the CB region 52 abuts the isolation region 10 and the extrinsic base contact region 22. The CB region 52 is shown as a region within the oxide 51, which is formed as noted herein.

As shown, the IC structure 102 can include: a stack region 27; and a silicon substrate underlying and contacting the stack region 27, the silicon substrate including: a silicon region 16 including a doped subcollector region 18; a set of isolation regions 10 overlying the silicon region 16; a base region 25 between the set of isolation regions 10 and below the stack region 27, the base region 25 including an intrinsic base 26 contacting the stack region 27, an extrinsic base 24 contacting the intrinsic base 26 and the stack region 27, and an (amorphized) extrinsic base contact region 22 contacting the extrinsic base 24; a collector region 20 between the set of isolation regions 10; a collector-base region (undercut, e.g., formed by undercut process described herein) 52 below the set of isolation regions 10 and the base region 25; and a collector contact region 54 contacting the collector region 20 under the intrinsic base 26 via the doped subcollector region. The IC structure 102 can also include a silicide region 54 within the extrinsic base 24 (and the extrinsic base contact region 22), as well as a contact 56 (several shown), contacting the silicide region 54. In some embodiments, the stack 27 can include two PNPs 28, with an emitter region 34 between the two PNPs 28, and a polysilicon layer 36 over the emitter region 34. The stack 27 can further include a silicide layer 54 over the polysilicon layer 36, and a contact 56 contacting the silicide 54. As shown, the collector-base region 52 abuts the isolation region 10 and the extrinsic base contact region 22, and the collector-base region 52 does not extend laterally (left-to-right across the page) beyond the isolation region 10 or beyond the extrinsic base contact region 22.

Figure 5:
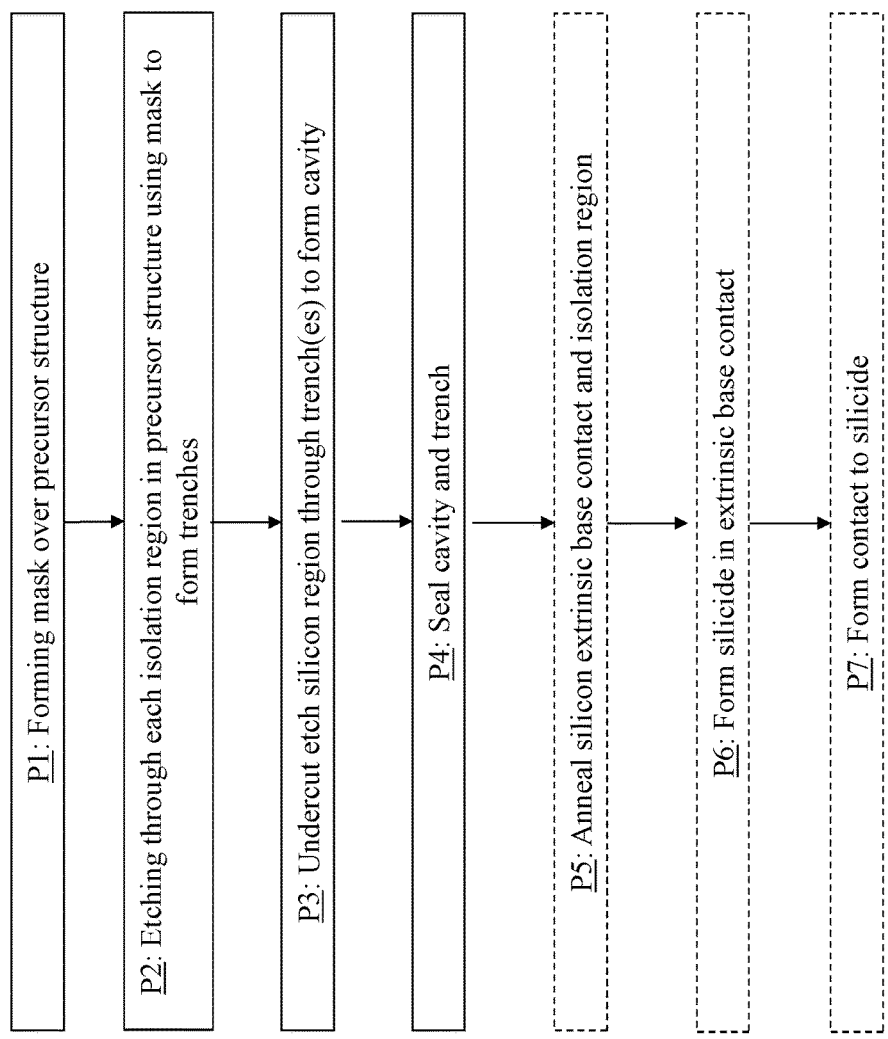
FIG. 5 shows a flow diagram illustrating processes according to various embodiments.

FIG. 5 shows a flow diagram illustrating a process according to various embodiments. Various sub-processes shown and described with respect to FIG. 5 can be performed as described herein with respect to FIGS. 1-4. It is understood that these processes may be performed in the order indicated, but may also be performed in another or other orders according to various embodiments. According to some embodiments, a process can include:

Process P1: forming a mask over a precursor IC structure 2;

Process P2: etching through each of the isolation regions 10 in the IC structure 2 into the silicon region 16 using the mask to form a trench 46 in each of the isolation regions 10;

Process P3: undercut etching the silicon region 16 through the trench 46 to form a cavity 44, wherein the silicon substrate 16 etches at a rate greater than an etch rate of each of the isolation regions 10 and the extrinsic base contact region 22 in the IC structure 2; and Process P4: sealing the cavity 44 and the trench 46.

In some cases, the process can include optional additional processes such as:

Process P5 (shown in phantom as optional): annealing the silicon extrinsic base contact region 22 and the isolation regions 10 (e.g., after the sealing of the cavity 44); and Process P6 (shown in phantom as optional): forming a silicide 54 in the extrinsic base contact region 22; and Process P7 (shown in phantom as optional): forming a contact 56 to the silicide 54 (and collector contact region 21).

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. An integrated circuit (IC) structure comprising:
a stack region; and
a silicon substrate underlying and contacting the stack region, the silicon substrate including:
   a silicon region including a doped subcollector region;
   a set of isolation regions overlying the silicon region;
   a base region between the set of isolation regions and below the stack region, the base region including an intrinsic base contacting the stack region, an extrinsic base contacting the intrinsic base and the stack region, and an amorphized extrinsic base contact region contacting the extrinsic base;
   a collector region between the set of isolation regions;
   an undercut collector-base region between the set of isolation regions and below the base region; and
   a collector contact region contacting the collector region under the intrinsic base and the undercut collector-base region via the doped subcollector region,
   wherein the undercut collector-base region does not extend laterally beyond the amorphized extrinsic base contact region, and
   wherein the undercut collector-base region abuts one of the isolation regions in the set and the amorphized extrinsic base contact region.

2. An integrated circuit (IC) structure comprising:
a stack region; and
a silicon substrate underlying and contacting the stack region, the silicon substrate including:
   a silicon region including a doped subcollector region;
   a set of isolation regions overlying the silicon region;
   a base region between the set of isolation regions and below the stack region, the base region including an intrinsic base contacting the stack region, an extrinsic base contacting the intrinsic base and the stack region, and an amorphized extrinsic base contact region contacting the extrinsic base;
   a collector region between the set of isolation regions;
   an undercut collector-base region between the set of isolation regions and below the base region, wherein the undercut collector-base region does not extend laterally beyond the set of isolation regions; and
   a collector contact region contacting the collector region under the intrinsic base and the undercut collector-base region via the doped subcollector region,
   wherein the undercut collector-base region does not extend laterally beyond the amorphized extrinsic base contact region.

* * * * *